(12) United States Patent
Nakano et al.

(10) Patent No.: US 6,359,521 B1
(45) Date of Patent: Mar. 19, 2002

(54) OSCILLATOR WITH BUFFER CIRCUIT IN WHICH DETERIORATION IN C/N RATIO IS LIGHTENED

(75) Inventors: Kazuhiro Nakano; Isao Ishigaki, both of Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/644,278

(22) Filed: Aug. 22, 2000

(30) Foreign Application Priority Data

Sep. 1, 1999 (JP) .......................................... 11-246855

(51) Int. Cl.⁷ .............................. H03B 1/00; H03B 5/12
(52) U.S. Cl. .............................. 331/117 R; 331/117 D; 331/74; 331/177 V; 331/185
(58) Field of Search .................. 331/60, 116 R, 331/116 FE, 117 R, 117 FE, 117 D, 74–77, 185, 177 V

(56) References Cited

U.S. PATENT DOCUMENTS 4,797,638 A * 1/1989 Usui et al. .............. 331/117 D

FOREIGN PATENT DOCUMENTS

JP        11-312924        11/1999

* cited by examiner

*Primary Examiner*—David Mis
(74) *Attorney, Agent, or Firm*—Beyer Weaver & Thomas, LLP

(57) ABSTRACT

An oscillator with a buffer circuit comprises: an oscillation circuit having an oscillation transistor; and a buffer circuit which has an amplification transistor and amplifies an oscillation signal outputted from the oscillation circuit by the amplification transistor. A power supply voltage is applied to the collector of either the oscillation transistor or the amplification transistor, the emitter of the other transistor has a D.C. ground connection, and the emitter of the transistor to which the power supply voltage is applied is connected to the collector of the other transistor via a resistor.

9 Claims, 3 Drawing Sheets

OSCILLATOR WITH BUFFER CIRCUIT IN WHICH DETERIORATION IN C/N RATIO IS LIGHTENED

BACKGROUND OF THE INVENTION

1. Field of the Invention

The present invention relates to an oscillator with a buffer circuit, for use in a portable telephone or the like.

2. Description of the Related Art

FIG. 5 shows the construction of a conventional oscillator with a buffer circuit. An oscillation circuit 41 is of a common-collector connection type and comprises: an oscillation transistor 41a; a grounding capacitor 41b for connecting the collector of the oscillation transistor 41a to the ground so as to pass high frequencies; a feedback capacitor 41c connected between the base and the emitter of the oscillation transistor 41a; a feedback capacitor 41d connected between the emitter the oscillation transistor 41a and the ground; an inductance device 41e connected between the base of the oscillation transistor 41a and the ground; and a varactor diode 41f. The inductance device 41e takes the form of a strip line.

A buffer circuit 42 has an amplification transistor 42a and is an amplification circuit of a common-emitter connection type. The emitter of the amplification transistor 42a has a D.C. ground connection via an emitter bias resistor 42b and, further, connected to the ground via a bypass capacitor 42c so as to pass high frequencies.

The emitter of the oscillation transistor 41a and the collector of the amplification transistor 42a are connected via a choke inductor 43. A common collector current is passed to the oscillation transistor 41a and the amplification transistor 42a by a power supply voltage Vb applied to the collector of the oscillation transistor 41a.

A control voltage Vc is applied to the cathode of the varactor diode 41f via a choke inductor 44, the oscillation circuit 41 oscillates at a frequency determined by the voltage value, and the oscillation signal is outputted from the emitter of the oscillation transistor 41a and is supplied to the base of the amplification transistor 42a via a coupling capacitor 45. The amplified oscillation signal is outputted from the collector of the amplification transistor 42a to a load via a d.c. blocking capacitor 46.

In the conventional oscillator with the buffer circuit, since the emitter of the oscillation transistor 41a and the collector of the amplification transistor 42a are connected to each other via the choke inductor 43 and the potential at the emitter and that at the collector are equal to each other. The power supply voltage Vb is therefore applied to the collector of the amplification transistor 42a with little attenuation of ripples of the power supply voltage Vb, and the ripple component is multiplexed on the oscillation signal amplified by the buffer circuit 42. Consequently, the C/N ratio of the oscillation signal to be outputted deteriorates.

Since the phase of an amplified oscillation signal appearing at the collector of the amplification transistor 42a and that of an oscillation signal to be applied from the emitter of the oscillation transistor 41a to the collector of the amplification transistor 42a via the choke inductor 43 are opposite to each other, the level of the oscillation signal outputted from the collector of the amplification transistor 42a decreases.

Further, since the emitter of the oscillation transistor 41a is connected to the load via the choke inductor 43 and the d.c. blocking capacitor 46, the load and the choke inductor 43 are arranged in series and interposed as an equivalent feedback capacitance between the emitter of the oscillation transistor 41a and the ground. The equivalent feedback capacitance changes according to the frequency characteristic of the reactance component of the load and a problem such that the oscillation frequency fluctuates occurs.

SUMMARY OF THE INVENTION

It is an object of the invention to provide an oscillator with a buffer circuit in which deterioration in the C/N ratio due to ripples of the power supply voltage is lessened, fluctuations in the oscillation frequency caused by a change in the reactance of a load is suppressed and, further, an oscillation signal is sufficiently amplified by a buffer circuit.

In order to achieve the subject, according to the invention, there is provided an oscillator with a buffer circuit, comprising: an oscillation circuit having an oscillation transistor; and a buffer circuit which has an amplification transistor and amplifies an oscillation signal outputted from the oscillation circuit by the amplification transistor, wherein a power supply voltage is applied to the collector of either the oscillation transistor or the amplification transistor, the emitter of the other transistor has a D.C. ground connection, and the emitter of the transistor to which the power supply voltage is applied is connected to the collector of the other transistor via a resistor.

In the oscillator with a buffer circuit according to the invention, the power supply voltage is applied to the collector of the oscillation transistor, the oscillation circuit is of a common-collector connection type, the buffer circuit is an amplification circuit of a common-base connection type, and an oscillation signal is supplied from the emitter of the oscillation transistor to the emitter of the amplification transistor.

In the oscillator with a buffer circuit according to the invention, the power supply voltage is applied to the collector of the oscillation transistor, the oscillation circuit is an oscillation circuit of a common-base connection type, an amplification circuit of a common-emitter connection type is used as the buffer circuit, and an oscillation signal is supplied from the emitter of the oscillation transistor to the base of the amplification transistor.

In the oscillator with a buffer circuit according to the invention, the base of the oscillation transistor and the base of the amplification transistor are connected via a bias resistor, a base bias voltage is applied to the oscillation transistor, and the emitter of the amplification transistor has a D.C. ground connection.

In the oscillator with a buffer circuit according to the invention, the base of the oscillation transistor and the base of the amplification transistor are connected via a bias resistor, a base bias voltage is applied to the oscillation transistor, and the emitter of the amplification transistor is directly connected to the ground.

In the oscillator with a buffer circuit according to the invention, the power supply voltage is applied to the collector of the amplification transistor and an -amplifier of a common-emitter connection type is used as the buffer circuit.

In the oscillator with a buffer circuit according to the invention, the oscillation circuit is of a common-collector connection type and an oscillation signal is supplied from the emitter of the oscillation transistor to the base of the amplification transistor.

In the oscillator with a buffer circuit according to the invention, the base of the amplification transistor and the base of the oscillation transistor are connected via a bias resistor, a base bias voltage of the amplification transistor is applied, and the emitter of the oscillation transistor has a D.C. ground connection.

In the oscillator with a buffer circuit according to the invention, the base of the amplification transistor and the base of the oscillation transistor are connected via a bias resistor, a base bias voltage of the amplification transistor is applied, and the emitter of the oscillation transistor is directly connected to the ground.

DETAILED DESCRIPTION OF THE PREFERRED EMBODIMENTS

Figure 1:
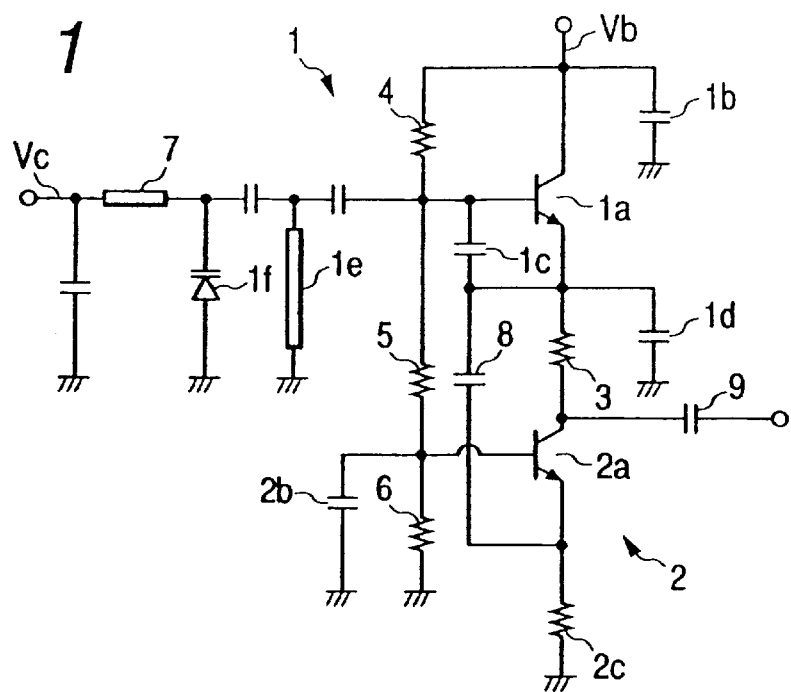
FIG. 1 is a circuit construction diagram showing a first embodiment of an oscillator with a buffer circuit of the invention.

FIG. 1 is a circuit construction diagram of a first embodiment of an oscillator with a buffer circuit of the invention. An oscillation circuit 1 is of a common-collector connection type and comprises: an oscillation transistor 1a; a grounding capacitor 1b for connecting the collector to the ground so as to pass high frequencies; a feedback capacitor 1c connected between the base and the emitter of the oscillation transistor 1a; a feedback capacitor 1d connected between the emitter of the oscillation transistor 1a and the ground; an inductance device 1e connected between the base of the oscillation transistor 1a and the ground; and a varactor diode 1f connected between the base of the oscillation transistor 1a and the ground.

A buffer circuit 2 has an amplification transistor 2a and is an amplification circuit of a base-common connection type. The base of the amplification transistor 2a is connected to the ground via a grounding capacitor 2b so as to pass high frequencies and the emitter is connected to the ground via an emitter bias resistor 2c.

The emitter of the oscillation transistor 1a and the collector of the amplification transistor 2a are connected via a resistor 3. A bias voltage is applied to the base of each of the oscillation transistor 1a and the amplification transistor 2a via base bias resistors 4, 5 and 6 which are connected in series between the power source and the ground, and a common collector current is passed to the oscillation transistor 1a and the amplification transistor 2a.

A control voltage Vc is applied to the cathode of the varactor diode 1f via a choke inductor 7. The oscillation circuit 1 oscillates at a frequency determined by the voltage value, and the oscillation signal is outputted from the emitter of the oscillation transistor 1a and is supplied to the emitter of the amplification transistor 2a via a coupling capacitor 8. The amplified oscillation signal is outputted from the collector of the amplification transistor 2a to a load (not shown) via a d.c. blocking capacitor 9.

In the construction, a voltage drop is caused by the resistor 3, so that the ripples of the power supply voltage Vb are reduced and the resultant is supplied to the collector of the amplification transistor 2a. Since the phase of an amplified oscillation signal appearing at the collector and that of an oscillation signal appearing at the emitter of the oscillation transistor 1a are equal to each other, the level of the oscillation signal outputted from the collector does not drop.

Further, the load is connected to the emitter of the oscillation transistor 1a via the resistor 3, so that a change in the equivalent feedback capacitance due to a change in the reactance component of the load is reduced.

Figure 2:
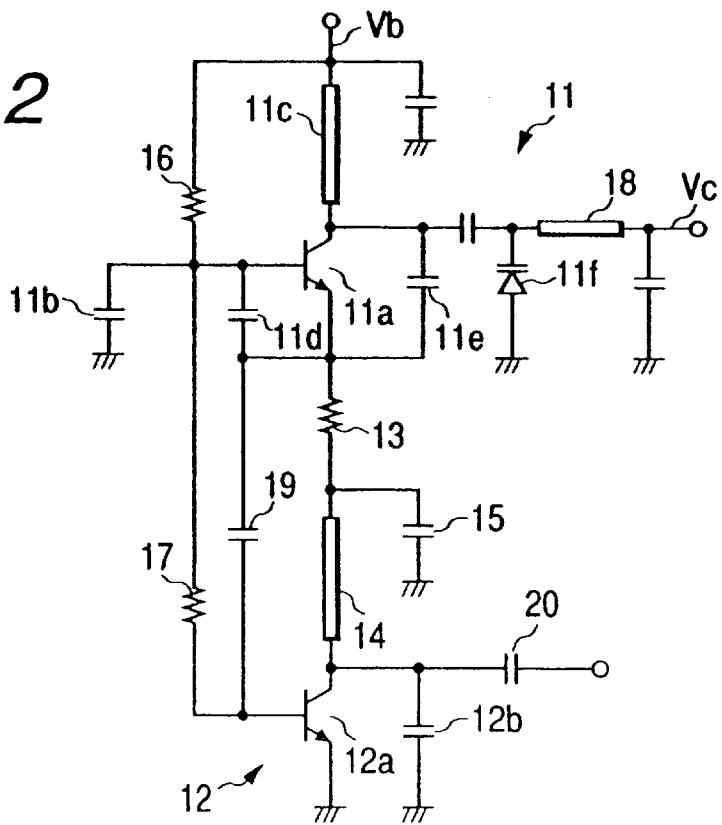
FIG. 2 is a circuit construction diagram showing a second embodiment of an oscillator with a buffer circuit of the invention.

FIG. 2 shows the circuit construction of a second embodiment of an oscillator with a buffer circuit of the invention. An oscillation circuit 11 is of a common-base connection type and comprises: an oscillation transistor 11a; a grounding capacitor 11b for connecting the base of the oscillation transistor 11a to the ground so as to pass high frequencies; an inductance device 11c for applying a power supply voltage Vb to the collector of the oscillation transistor 11a; a feedback capacitor 11d connected between the base and the emitter of the oscillation transistor 11a; a feedback capacitor 11e connected between the emitter and the collector of the oscillation transistor 11a; and a varactor diode 11f connected between the collector and the ground.

A buffer circuit 12 has an amplification transistor 12a and is an amplification circuit of a common-emitter connection type. The emitter of the amplification transistor 12a is directly connected to the ground and the collector is connected to the ground via a resonance capacitor 12b.

The emitter of the oscillation transistor 11a and the collector of the amplification transistor 12a are connected via a series circuit of a resistor 13 and the choke inductor 14. A connection point of the resistor 13 and the choke inductor 14 is connected to the ground via a grounding capacitor 15 so as to pass high frequencies. A bias voltage is applied to the base of each of the oscillation transistor 11a and the amplification transistor 12a via base bias resistors 16 and 17 which are connected between the power source and the base of the amplification transistor 12a. A common collector current is passed to the oscillation transistor 11a and the amplification transistor 12a. The collector current is determined by the value of the resistor 13.

A control voltage Vc is applied to the cathode of the varactor diode 11f via a choke inductor 18, the oscillation circuit 11 oscillates at a frequency determined by the voltage value, and the oscillation signal is outputted from the emitter of the oscillation transistor 11a and is supplied to the base of the amplification transistor 12a via a coupling capacitor 19. The amplified oscillation signal resonates to a resonance circuit of the choke inductor 14 and the resonance capacitor 12b and is outputted from the collector of the amplification transistor 12a to a load (not shown) via a d.c. blocking capacitor 20.

In the construction, a voltage drop is caused by the resistor 13, so that the ripples of the power supply voltage Vb are reduced and the resultant is supplied to the collector of the amplification transistor 12a. Since a connection point of the resistor 13 and the choke inductor 14 is connected to the ground so as to pass high frequencies, only an amplified oscillation signal appears at the collector of the amplification transistor 12a. Further, since the connection point of the resistor 13 and the choke inductor 14 is connected to the ground so as to pass high frequencies, the oscillation circuit 11 is not influenced by the reactance component of the load.

Figure 3:
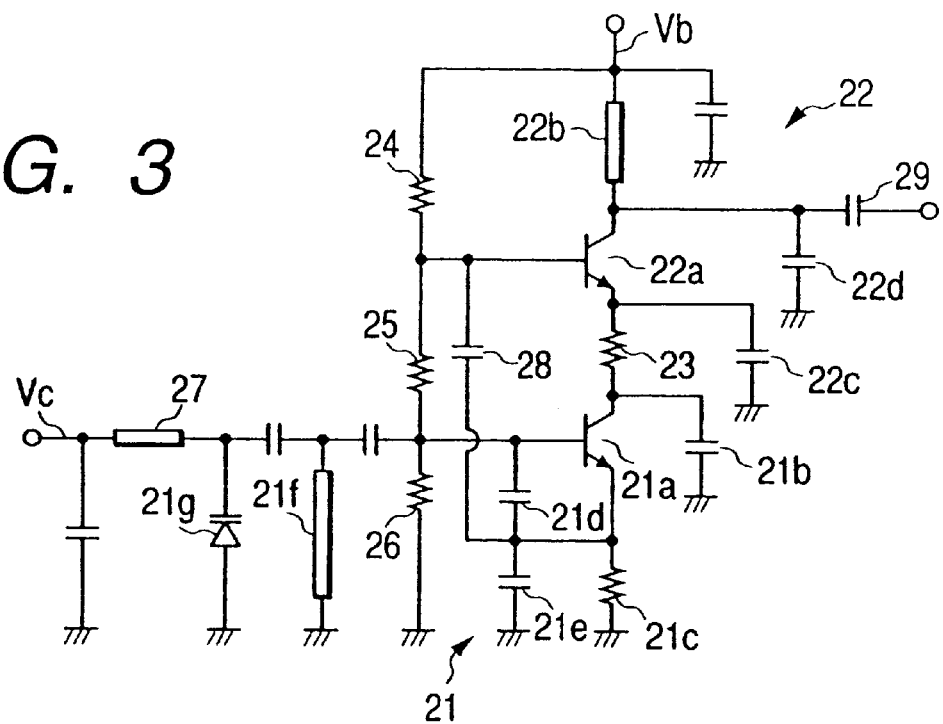
FIG. 3 is a circuit construction diagram showing a third embodiment of an oscillator with a buffer circuit of the invention.

FIG. 3 shows the circuit construction of a third embodiment of an oscillator with a buffer circuit of the invention.

An oscillation circuit 21 is of a common-collector connection type and comprises: an oscillation transistor 21a; a grounding capacitor 21b for connecting the collector of the oscillation transistor 21a to the ground so as to pass high frequencies; an emitter bias resistor 21c for connecting the emitter of the oscillation transistor 21a to the ground to pass D.C. currents; a feedback capacitor 21d connected between the base and the emitter of the oscillation transistor 21a; a feedback capacitor 21e connected between the emitter and the collector (ground); and an inductance device 21f and a varactor diode 21g each connected between the base and the ground.

A buffer circuit 22 has an amplification transistor 22a and is an amplification circuit of a common-emitter connection type. A power supply voltage Vb is applied to the collector of the amplification transistor 22a via a choke inductor 22b and the emitter of the amplification transistor 22a is connected to the ground via a grounding capacitor 22c so as to pass high frequencies. The collector of the oscillation transistor 22a is connected to the ground via a resonance capacitor 22d.

The emitter of the amplification transistor 22a and the collector of the oscillation transistor 21a are connected via a resistor 23. A bias voltage is applied to the base of each of the amplification transistor 22a and the oscillation transistor 21a via base bias resistors 24, 25 and 26 which are connected between the power source and the ground. A common collector current is passed to the amplification transistor 22a and the oscillation transistor 21a.

A control voltage Vc is applied to the cathode of the varactor diode 21g via a choke inductor 27, the oscillation circuit 21 oscillates at a frequency determined by the voltage value, and the oscillation signal is outputted from the emitter of the oscillation transistor 21a and is supplied to the base of the amplification transistor 22a via a coupling capacitor 28. The amplified oscillation signal resonates to a resonance circuit made by the choke inductor 22b and the resonance capacitor 22d and is outputted from the collector of the amplification transistor 22a to a load (not shown) via a d.c. blocking capacitor 29.

In the construction, a voltage drop is caused by the resistor 23, so that the ripples of the power supply voltage Vb are reduced and the resultant is supplied to the collector of the oscillation transistor 21a. Since both ends of the resistor 23 are connected to the ground so as to pass high frequencies, the two transistors are not coupled to each other at high frequencies. Further, since the buffer circuit 22 is provided on the power source side, the oscillation circuit 21 is not influenced by the reactance component of the load.

Figure 4:
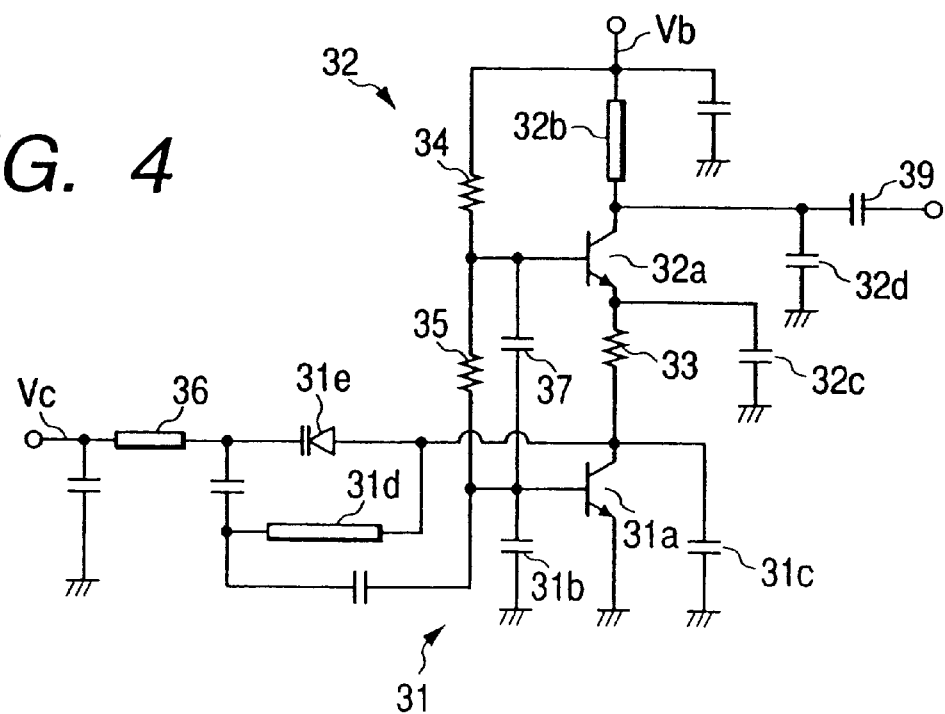
FIG. 4 is a circuit construction diagram showing a fourth embodiment of an oscillator with a buffer circuit of the invention.
Figure 5:
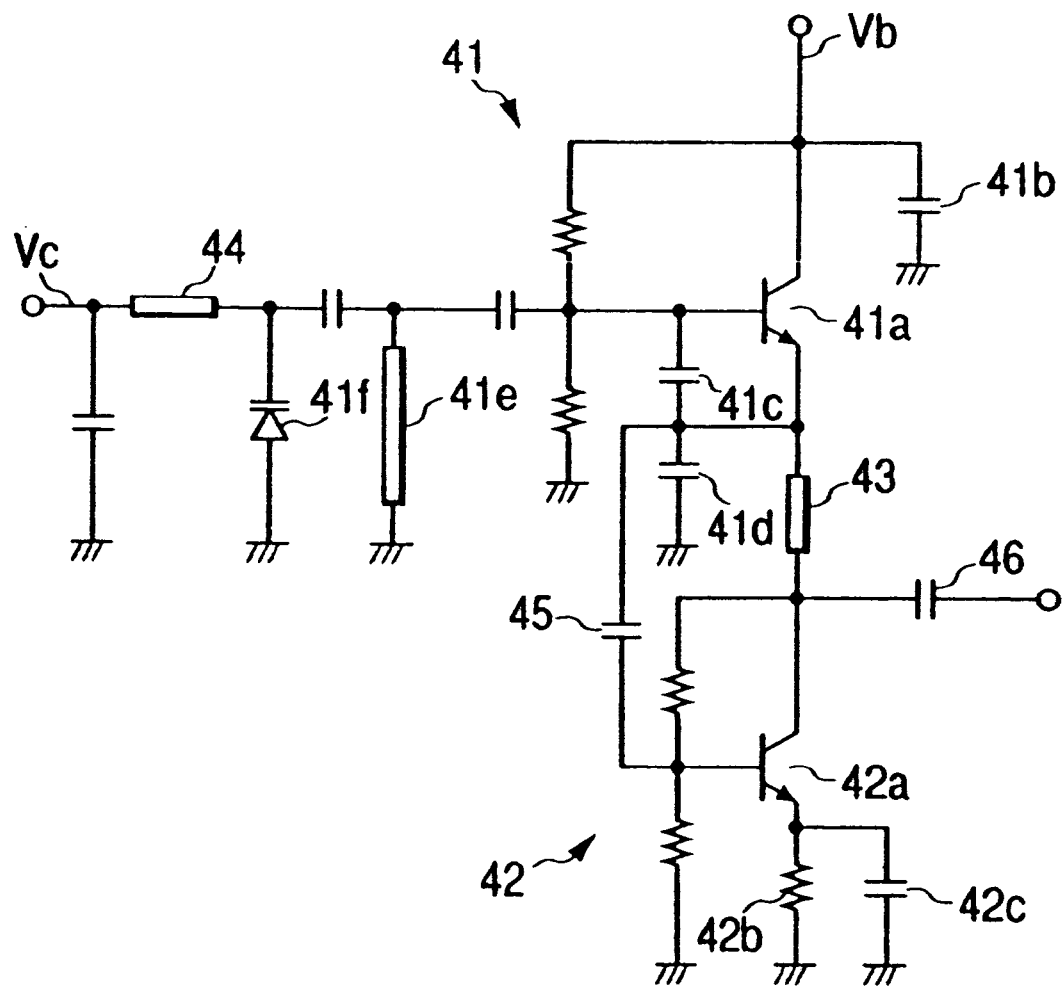
FIG. 5 is a circuit construction diagram of a conventional oscillator with a buffer circuit.

FIG. 4 shows the circuit construction of a fourth embodiment of an oscillator with a buffer circuit of the invention. An oscillation circuit 31 is of a common-emitter connection type and comprises: an oscillation transistor 31a whose emitter is directly connected to the ground; a feedback capacitor 31b connected between the base of the oscillation transistor 31a and the ground; a feedback capacitor 31c connected between the collector of the oscillation transistor 31a and the ground; an inductance device 31d connected between the collector and the base; and a varactor diode 31e.

A buffer circuit 32 has an amplification transistor 32a and is an amplification circuit of a common-emitter connection type. A power supply voltage Vb is applied to the collector of the amplification transistor 32a via a choke inductor 32b and the emitter of the amplification transistor 32a is connected to the ground via a grounding capacitor 32c so as to pass high frequencies. The collector of the amplification transistor 32a us connected to the ground via a resonance capacitor 32d.

The emitter of the amplification transistor 32a and the collector of the oscillation transistor 31a are connected via a resistor 33. A base bias voltage is applied to the base of each of the amplification transistor 32a and the oscillation transistor 31a via base bias resistors 34 and 35 which are connected between the power source and the base of the oscillation transistor 31a. A common collector current is passed to the amplification transistor 32a and the oscillation transistor 31a. The collector current is set by the resistor 33.

A control voltage Vc is applied to the cathode of the varactor diode 31e via a choke inductor 36, the oscillation circuit 31 oscillates at a frequency determined by the voltage value, and the oscillation signal is outputted from the base of the oscillation transistor 31a and is supplied to the base of the amplification transistor 32a via a coupling capacitor 37. The amplified oscillation signal resonates to a resonance circuit constructed by the choke inductor 32b and the resonance capacitor 32d and is outputted from the collector of the amplification transistor 32a to a load (not shown) via a d.c. blocking capacitor 39.

In the construction, a voltage drop is caused by the resistor 33, so that the ripples of the power supply voltage Vb are reduced and the resultant is supplied to the collector of the oscillation transistor 31a. Since the emitter of the amplification transistor 32a is connected to the ground so as to pass high frequencies, the two transistors are not coupled with each other at high frequencies. Since the buffer circuit 32 is provided on the power source side, the oscillation circuit 31 is not influenced by the reactance component of the load.

As described above, an oscillator with a buffer circuit of the invention comprises: an oscillation circuit having an oscillation transistor; and a buffer circuit which amplifies an oscillation signal by an amplification transistor. A power supply voltage is applied to the collector of either the oscillation transistor or the amplification transistor, the emitter of the other transistor has a D.C. ground connection, and the emitter of the transistor to which the power supply voltage is applied is connected to the collector of the other transistor via a resistor. A voltage drop is caused via the resistor, ripples of the power supply voltage are reduced and the resultant is applied to the collector of the other transistor. Deterioration in the C/N ratio caused by the other transistor can be therefore reduced.

In the oscillator with a buffer circuit according to the invention, the power supply voltage is applied to the collector of the oscillation transistor, the oscillation circuit is of a common-collector connection type, the buffer circuit is an amplification circuit of a common-base connection type, and an oscillation signal is supplied from the emitter of the oscillation transistor to the emitter of the amplification transistor. The phase of an amplified oscillation signal appearing at the collector and the phase of an oscillation signal appearing at the emitter of an oscillation transistor are equal to each other. Consequently, the level of an oscillation signal outputted from the collector does not drop.

Further, since a load is connected to the emitter of the oscillation transistor via the resistor, a change in an equivalent feedback capacitance due to a change in the reactance component of the load is reduced.

In the oscillator with a buffer circuit according to the invention, the power supply voltage is applied to the collector of the oscillation transistor, the oscillation circuit is an oscillation circuit of a common-base connection type, an amplification circuit of a common-emitter connection type is used as the buffer circuit, and an oscillation signal is supplied from the emitter of the oscillation transistor to the base of the amplification transistor. Since the load is connected to the emitter of the oscillation transistor via the resistor, a change in the equivalent feedback capacitance caused by a change in the reactance component of the load is reduced.

In the oscillator with a buffer circuit according to the invention, a choke inductor is connected between the resistor and the collector of the amplification transistor, and a connection point of the resistor and the choke inductor is connected to the ground so as to pass high frequencies. Only an amplified signal therefore appears at the collector of the amplification transistor. Further, since the connection point between the resistor and the choke inductor is connected to the ground so as to pass high frequencies, an influence by the reactance component of the load onto the oscillation circuit is further decreased.

In the oscillator with a buffer circuit according to the invention, the base of the oscillation transistor and the base of the amplification transistor are connected via a bias resistor, a base bias voltage is applied to the oscillation transistor, and the emitter of the amplification transistor has a D.C. ground connection. Thus, a DC bias circuit in the amplification transistor can be simplified.

In the oscillator with a buffer circuit according to the invention, the power supply voltage is applied to the collector of the amplification transistor and an amplifier of a common-emitter connection type is used as the buffer circuit. Consequently, an influence by the reactance component of the load onto the oscillation circuit is eliminated.

In the oscillator with a buffer circuit according to the invention, the oscillation circuit is of a common-emitter connection type and an oscillation signal is supplied from the base of the oscillation transistor to the base of the amplification transistor. Both ends of the resistor are connected to the ground so as to pass high frequencies, so that the two transistors are not coupled to each other at high frequencies.

In the oscillator with a buffer circuit according to the invention, the base of the amplification transistor and the base of the oscillation transistor are connected via a bias resistor, a base bias voltage of the amplification transistor is applied, and the emitter of the oscillation transistor has a D.C. ground connection. Thus, the DC bias circuit in the oscillation transistor can be simplified.

What is claimed is:

1. An oscillator with a buffer circuit, comprising:
   an oscillation circuit having an oscillation transistor for generating an oscillation signal, wherein the oscillation transistor is coupled in a common-collector configuration with a collector of the oscillation transistor being coupled to a power supply voltage; and
   a buffer circuit which amplifies the oscillation signal using an amplification transistor, which amplification transistor is coupled in a common-base configuration with an emitter of the amplification transistor having a D.C. ground connection, an emitter of the oscillation transistor being coupled to the emitter of the amplification transistor so that the oscillation signal is supplied to the emitter of the amplification transistor.

2. An oscillator with a buffer circuit, comprising:
   an oscillation circuit having an oscillation transistor for generating an oscillation signal, wherein the oscillation transistor is coupled in a common-base configuration with a collector of the oscillation transistor being coupled to a power supply voltage; and
   a buffer circuit which amplifies the oscillation signal using an amplification transistor, which amplification transistor is coupled in a common-emitter configuration with an emitter of the amplification transistor having a D.C. ground connection, an emitter of the oscillation transistor being coupled to a base of the amplification transistor so that the oscillation signal is supplied to the base of the amplification transistor.

3. An oscillator with a buffer circuit according to claim 2, wherein a choke inductor is connected between a resistor and a collector of the amplification transistor, and a connection point of the resistor and the choke inductor is connected to the ground connection so as to pass high frequencies.

4. An oscillator with a buffer circuit according to claim 2, herein a base of the oscillation transistor and the base of the amplification transistor are connected via a bias resistor, a base bias voltage is applied to the base of the oscillation transistor, and the emitter of the amplification transistor is directly connected to the ground connection.

5. An oscillator with a buffer circuit according to claim 3, wherein a base of the oscillation transistor and the base of the amplification transistor are connected via a bias resistor, a base bias voltage is applied to the base of the oscillation transistor, and the emitter of the amplification transistor is directly connected to the ground connection.

6. An oscillator with a buffer circuit according to claim 2, wherein the power supply voltage is additionally applied to a collector of the amplification transistor.

7. An oscillator with a buffer circuit, comprising:
   an oscillation circuit having an oscillation transistor for generating an oscillation signal, wherein the oscillation transistor is coupled in a common-collector configuration with a collector of the oscillation transistor being coupled to a power supply voltage; and
   a buffer circuit which amplifies the oscillation signal using an amplification transistor, which amplification transistor is coupled in a common-emitter configuration with an emitter of the amplification transistor having a D.C. ground connection, an emitter of the oscillation transistor being coupled to a base of the amplification transistor so that the oscillation signal is supplied to the base of the amplification transistor.

8. An oscillator with a buffer circuit, comprising:
   an oscillation circuit having an oscillation transistor for generating an oscillation signal, wherein the oscillation transistor is coupled in a common-emitter configuration with a collector of the oscillation transistor being coupled to a power supply voltage; and
   a buffer circuit which amplifies the oscillation signal using an amplification transistor, which amplification transistor is coupled in a common-emitter configuration with an emitter of the amplification transistor having a D.C. ground connection, a base of the oscillation transistor being coupled to a base of the amplification transistor so that the oscillation signal is supplied to the base of the amplification transistor.

9. An oscillator with a buffer circuit according to claim 8, wherein the base of the amplification transistor and the base of the oscillation transistor are connected via a bias resistor, a base bias voltage is applied to the amplification transistor and the emitter of the oscillation transistor is directly connected to a ground voltage potential.

* * * * *